United States Patent
Yeh et al.

[11] Patent Number: 6,117,743
[45] Date of Patent: Sep. 12, 2000

[54] METHOD OF MANUFACTURING MOS DEVICE USING ANTI REFLECTIVE COATING

[75] Inventors: Wen-Kuan Yeh, Hsinchu Hsien; Tony Lin, Kaohsiung Hsien; Coming Chen, Taoyuan Hsien, all of Taiwan

[73] Assignee: United Microelectronics Corp., Hsinchu, Taiwan

[21] Appl. No.: 09/203,023

[22] Filed: Dec. 1, 1998

[51] Int. Cl.[7] .................................................. H01L 21/336
[52] U.S. Cl. ........................ 438/301; 438/437; 438/653; 438/682; 438/683; 438/952
[58] Field of Search ................................. 438/301, 437, 438/653, 952, 682, 683

[56] References Cited

U.S. PATENT DOCUMENTS

| | | |
|---|---|---|
| 5,498,889 | 3/1996 | Hayden . |
| 5,576,227 | 11/1996 | Hsu . |
| 5,902,125 | 5/1999 | Wu . |
| 5,930,617 | 7/1999 | Wu . |
| 5,950,090 | 9/1999 | Chen et al. . |
| 5,956,584 | 9/1999 | Wu et al. . |
| 5,998,286 | 12/1999 | Chen et al. . |
| 6,004,843 | 12/1999 | Huang . |
| 6,010,968 | 1/2000 | Yang et al. . |
| 6,013,547 | 1/2000 | Liaw . |
| 6,013,574 | 1/2000 | Hause et al. . |
| 6,015,741 | 1/2000 | Lin et al. . |
| 6,015,748 | 5/1999 | Kim et al. . |
| 6,022,795 | 2/2000 | Chen et al. . |
| 6,048,765 | 1/2000 | Wu et al. . |
| 6,051,467 | 1/2000 | Chan et al. . |

*Primary Examiner*—John F. Niebling
*Assistant Examiner*—Jonathan Hack
*Attorney, Agent, or Firm*—Hickman Coleman & Hughes, LLP

[57] ABSTRACT

A method of manufacturing MOS device including the steps of providing a semiconductor substrate that has a device isolation structure thereon, and then depositing a gate oxide layer, a polysilicon layer and an anti-reflection coating in sequence over the substrate. Next, a gate structure is patterned out of the gate oxide layer, the polysilicon layer and the anti-reflection coating. Then, spacers are formed on the sidewalls of the gate structure. Thereafter, a metal silicide layer is formed over source/drain regions. After that, an inter-layer dielectric (ILD) layer is formed over the gate structure and the entire substrate. Then, the inter-layer dielectric layer is planarized to expose the anti-reflection coating. Next, the anti-reflection coating is removed, and then a barrier layer is deposited over the inter-layer dielectric layer and the polysilicon layer. Subsequently, a conductive layer is deposited over the barrier layer. Finally, a chemical-mechanical polishing operation is carried out to planarize the conductive layer, retaining only the conductive layer above the polysilicon layer.

17 Claims, 5 Drawing Sheets

METHOD OF MANUFACTURING MOS DEVICE USING ANTI REFLECTIVE COATING

BACKGROUND OF THE INVENTION

1. Field of Invention

The present invention relates to a method of manufacturing integrated circuit. More particularly, the present invention relates to a method of manufacturing MOS device.

2. Description of Related Art

Metal silicide is a common material deposited over the gate terminals or interconnects of a semiconductor substrate for lowering contact resistance. In general, a metal silicide layer is formed by a chemical vapor deposition or a sputtering method. Thereafter, the silicide layer must undergo a high temperature annealing operation so that the lattice structure within the silicon nitride layer can be rearranged to eliminate various kinds of crystal defects. After awhile, defect-free grains gradually replace the original grains. This phenomenon is known as re-crystallization. The annealed crystalline metal silicide layer has a lower resistance than the amorphous silicide layer before the annealing operation. Since photolithographic operation is unnecessary in the process of forming a metal silicide layer, the metal silicide is formed by a self-aligned process. With ease of processing and low contact resistance, the self-aligned silicide process is now a common means of forming metallic contacts.

As the level of device integration increases, resistance in the source/drain regions of a MOS device will also increase. When the resistance in the source/drain regions has risen to a level almost equal to the MOS channel, a self-aligned suicide (also known as Salicide) layer must be formed over the source/drain regions. The self-aligned silicide layer not only can lower the sheet resistance in the source/drain regions, but integrity of the shallow junction between metal and the MOS can also be ensured as well.

Self-aligned silicide process is a common method of forming a metal silicide layer over a polysilicon gate electrode, thereby downward adjusting the value of resistance there. FIGS. 1A through 1C are cross-sectional views showing the progression of manufacturing steps in fabricating a MOS device according to the first conventional method. First, as shown in FIG. 1A, a semiconductor substrate 10 having device isolation structures 12 thereon is provided. The semiconductor substrate 10 further includes a patterned gate oxide layer 13, a polysilicon gate 14 and ion-doped source/drain regions 16.

Next, as shown in FIG. 1B, a sputtering method is used to deposit a titanium layer 18 over the semiconductor substrate 10 and over the polysilicon gate 14.

Next, a rapid thermal process (RTP) is carried out to form a metal suicide layer 20 over the polysilicon gate 14 and the source/drain regions 16. Subsequently, a wet etching method is employed to remove the unreacted and residual metal, thereby forming a structure as shown in FIG. 1C.

However, due to the miniaturization of polysilicon gate, contact stress between the polysilicon layer and the metal silicide layer will increase considerably. Moreover, the number of nucleation sites for the re-crystallization of metal silicide will be greatly reduced as well. The reduction of nucleation sites combined with an increase in contact stress will lead to a modification of the metal/silicon ratio within a metal suicide layer, for example the value of x in titanium silicide silicide $TiSi_x$. Consequently, quality of the metal suicide film is poor and island shaped metal suicide layer structure will form. With a rough suicide layer as such, resistivity of the layer will increase and the operating speed of the gate terminal will be affected. For example, when a self-aligned silicide process is used to form a titanium silicide layer over the sub-quarter micron line (0.25 $\mu$m) of a logic device, the uneven distribution of heat in subsequent high temperature annealing process will distort the metal polycide layer, and hence leading to a narrow line effect that may seriously affect the operating characteristics of the gate terminal.

FIGS. 2A and 2B are cross-sectional views showing the progression of manufacturing steps in fabricating a MOS device according to the second conventional method. First, as shown in FIG. 2A, a semiconductor substrate 100 having device isolation Structures 102 thereon is provided. Then, a gate oxide layer 103 and a polysilicon layer 104 are sequentially deposited over the substrate 100. Thereafter, a tungsten layer 106 is formed over the polysilicon layer 104.

Next, as shown in FIG. 2B, a metallic gate is patterned out. The metallic gate includes a gate oxide layer 103', a polysilicon layer 104' and a metallic layer 106'. Subsequently, ions are implanted into the substrate 100 on each side of the metallic gate structure to form source/drain regions 108. Because metal is generally more difficult to be removed than non-metal, the metal must be bombarded by ions in a plasma etching operation. However, plasma etching will also generate large amount of particles, and some of these particles may end up inside the substrate causing device contamination. Furthermore, during plasma etching, some of the ions may possess a sufficiently high energy level to cause plasma damages.

In addition, conventional method of using a photoresist layer to pattern the tungsten layer will lead to pattern misalignment. This is because the tungsten layer easily reflected back some of the light needed for exposing the photoresist layer, and hence the incoming light will be improperly focused. When the pattern is misaligned, critical dimensions (CDs) will be out of control. Therefore, subsequent processing operations will be affected.

In the manufacturing of highly integrated circuits, dual gate electrodes of the N-type and the P-type are employed. To lower the resistance of these gate terminals, a polycide structure is frequently formed. The $n^+/p^+$ ions doped within the polysilicon layer in the gate region and the metal silicide layer on top, however, can easily cross-diffuse into each other through their junction. Hence, electrical properties of the electronic device may be affected.

In light of the foregoing, there is a need to provide an improved method of fabricating MOS device.

SUMMARY OF THE INVENTION

Accordingly, the present invention is to provide a method of manufacturing MOS device that can improve gate terminal stability and prevent the lowering of gate quality due to the reduction of line width. In addition, the method is also capable of preventing the cross-diffusion of dopants between the polysilicon layer and the metal silicide layer so that dimensions of device and device separation can be reduced further. Therefore, better electrical operating characteristics for the device can be obtained.

To achieve these and other advantages and in accordance with the purpose of the invention, as embodied and broadly described herein, the invention provides a method of manufacturing MOS device. The method includes the steps of providing a semiconductor substrate that has a device isolation structure thereon, and then depositing a gate oxide layer, a polysilicon layer and an anti-reflection coating in sequence over the substrate. Next, a gate structure is patterned out of the gate oxide layer, the polysilicon layer and the anti-reflection coating. Then, spacers are formed on the sidewalls of the gate structure. Thereafter, a metallic layer is deposited over the substrate, and then a metal silicide layer is formed over the source/drain regions. After that, an inter-layer dielectric (ILD) layer is formed over the gate structure and the entire substrate. Then, the inter-layer dielectric layer is planarized to expose the anti-reflection coating. Next, the anti-reflection coating is removed, and then a barrier layer is deposited over the inter-layer dielectric layer and the polysilicon layer. Subsequently, a conductive layer is deposited over the barrier layer. Finally, a chemical-mechanical polishing operation is carried out to planarize the conductive layer, retaining only the conductive layer above the polysilicon layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
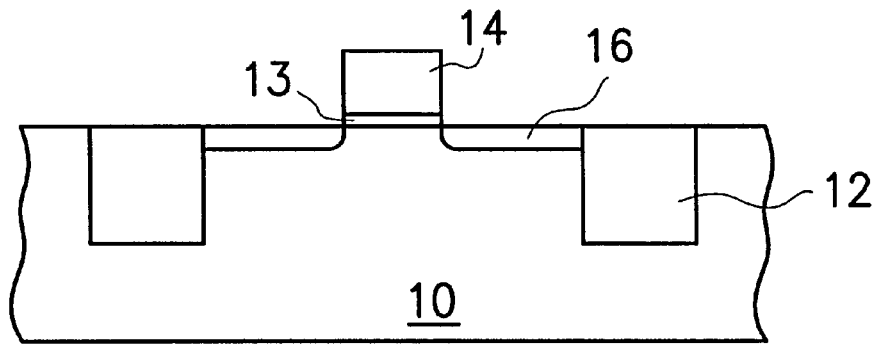
FIGS. 1A through 1C are cross-sectional views showing the progression of manufacturing steps in fabricating a MOS device according to the first conventional method.
Figure 1B:
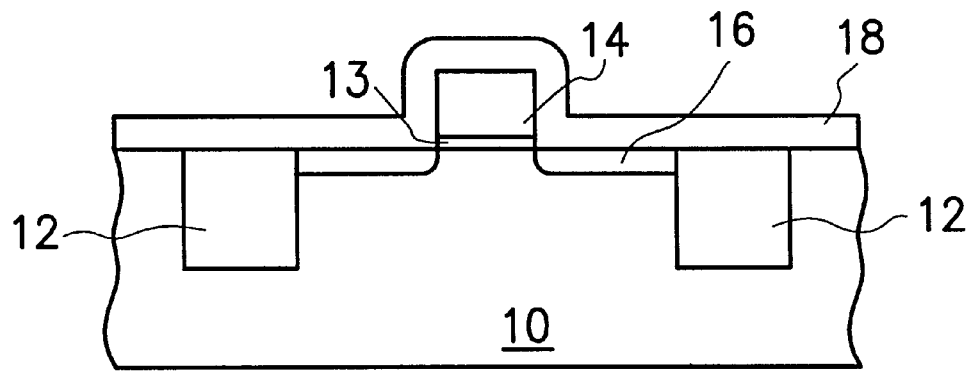
Figure 1C:
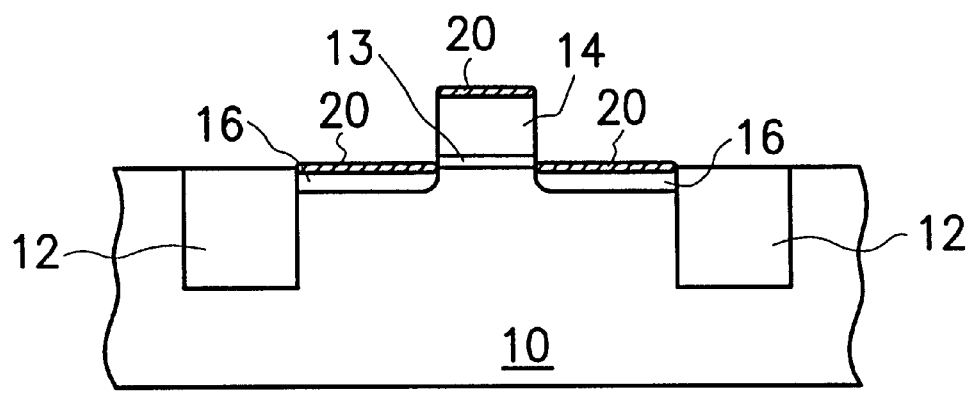
Figure 2A:
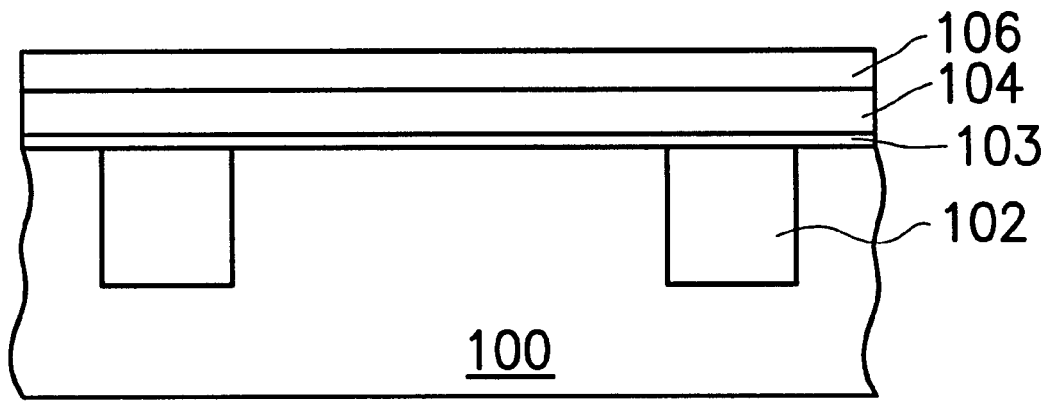
FIGS. 2A and 2B are cross-sectional views showing the progression of manufacturing steps in fabricating a MOS device according to the second conventional method.
Figure 2B:
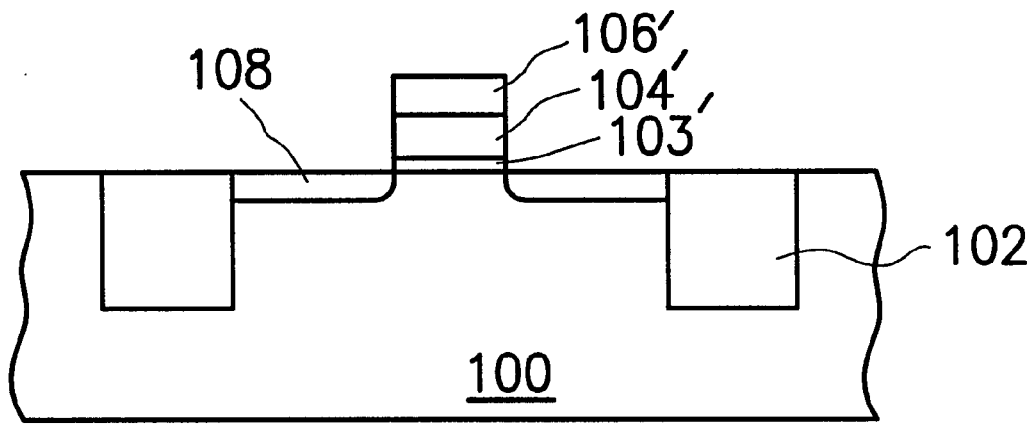

Reference will now be made in detail to the present preferred embodiments of the invention, examples of which are illustrated in the accompanying drawings. Wherever possible, the same reference numbers are used in the drawings and the description to refer to the same or like parts.

Figure 3A:
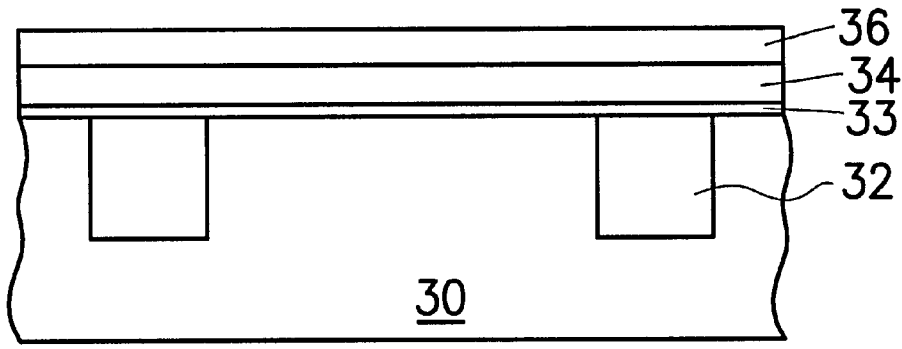
FIGS. 3A through 3H are cross-sectional views showing the progression of manufacturing steps in fabricating a MOS device according to one preferred embodiment of this invention.

FIGS. 3A through 3H are cross-sectional views showing the progression of manufacturing steps in fabricating a MOS device according to one preferred embodiment of this invention. As shown in FIG. 3A, a semiconductor substrate 30 having a device isolation structure 32 thereon is provided. A gate oxide layer 33, a polysilicon layer 34 and an anti-reflection coating 36 are formed in sequence over the substrate 30. The anti-reflection coating 36 having a thickness of about 2500 Å is preferably formed from material such as silicon oxynitride or silicon nitride. The device isolation structure 32 is mainly used for isolating out the active device region (not labeled). The most common type of device isolation structures 32 includes field oxide and shallow trench isolation structure.

Figure 3B:
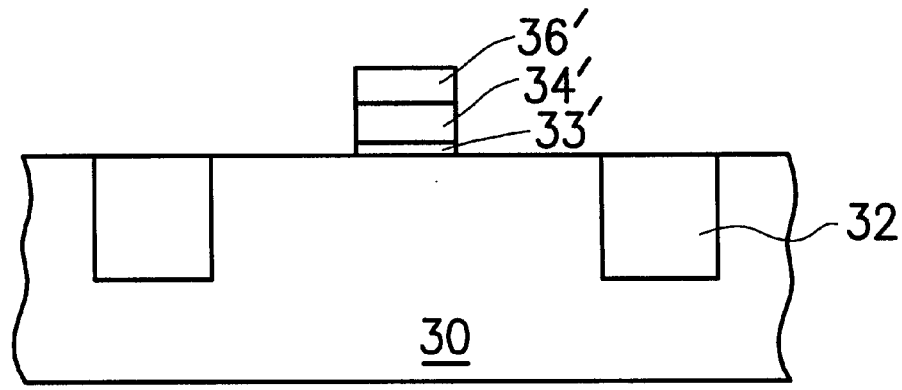

As shown in FIG. 3B, a mask patterning operation is carried out removing a portion of the anti-reflection layer 36, the polysilicon layer 34 and the gate oxide layer 33 to form a gate structure. The gate structure comprises a gate oxide layer 33', a polysilicon layer 34' and an anti-reflection layer 36'.

Figure 3C:
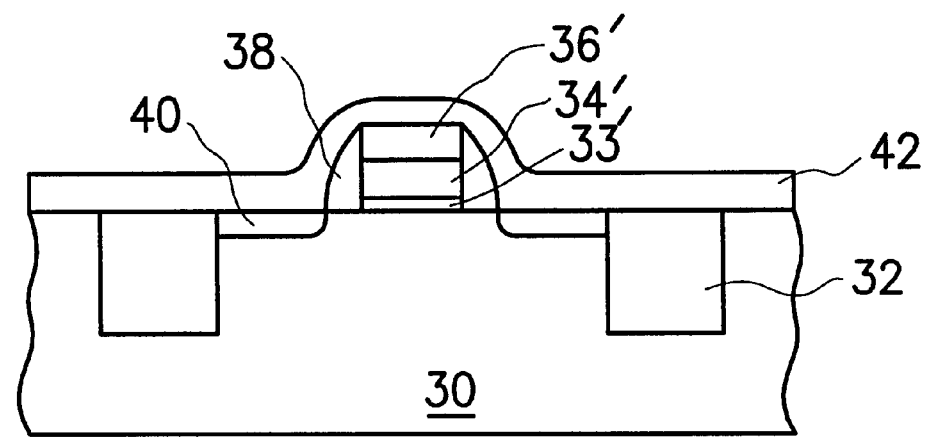

As shown in FIG. 3C, an oxide layer (not shown in the figure), preferably a silicon dioxide layer, is deposited over the semiconductor substrate 30. A portion of the oxide layer is removed to form spacers 38 on the sidewalls of the gate structure using, for example, a dry etching method. Subsequently, source/drain regions 40 are formed in the substrate on each side of the gate structure by performing an ion implantation. Then, a metallic layer 42 is deposited over the anti-reflection layer 36', the spacers 38 and the exposed substrate 30. The metallic layer 42 is preferably a titanium layer formed using, for example, a sputtering method.

Figure 3D:
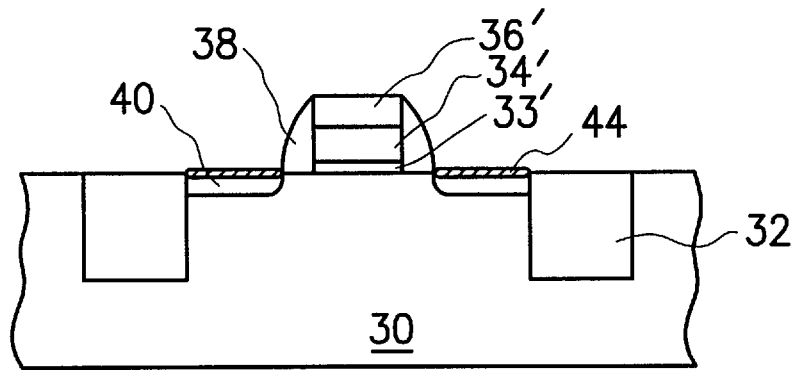

As shown in FIG. 3D, a metal silicide layer 44 is formed over the source/drain regions 40. The metal silicide layer 44 can be formed by carrying out a rapid thermal process to initiate the reaction between metal in the metallic layer 42 and silicon in the source/drain regions 40. Subsequently, the unreacted and residual metal is removed using, for example, a wet etching method.

Figure 3E:
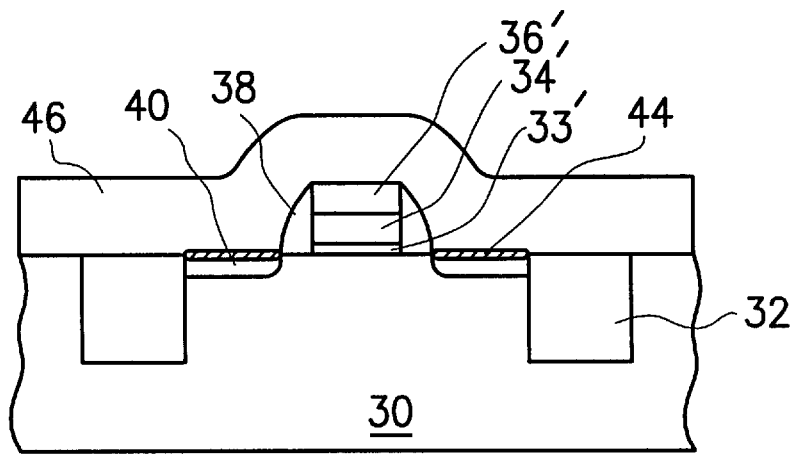

As shown in FIG. 3E, an inter-layer dielectric (ILD) layer 46 is formed over the semiconductor substrate 30, the spacers 38 and the anti-reflection coating 36'.

Figure 3F:
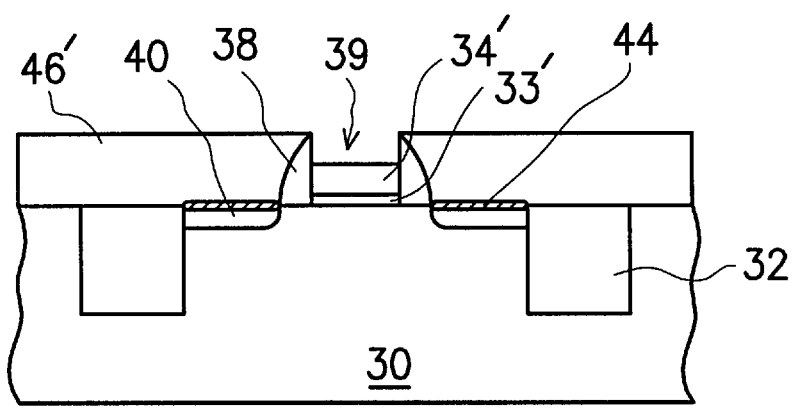

As shown in FIG. 3F, using the anti-reflection coating 36' as a polishing stop layer, the inter-layer dielectric layer 46 is planarized to expose the anti-reflection coating 36' using, for example, a chemical-mechanical polishing (CMP) method. Thereafter, the anti-reflection coating 36' is removed to form a groove 39 using hot phosphoric acid in a wet etching operation.

Figure 3G:
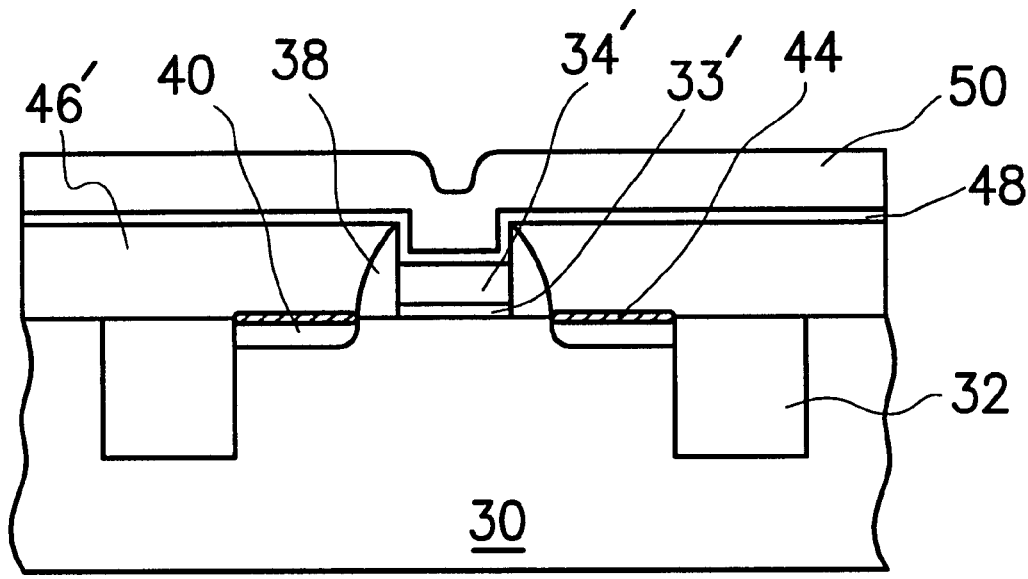

As shown in FIG. 3G, a barrier layer 48, preferably a titanium nitride (TiN) layer, is deposited over the entire substrate. The barrier layer 48 is used for preventing subsequently deposited metallic layer from contacting the polysilicon layer 34'. Hence, for device having a dual gate structure, cross diffusion between the ions within the polysilicon layer and the metallic layer is prevented even when subsequent high temperature processing operations are carried out. Thereafter, a conductive layer 50, preferably a tungsten layer, is deposited over the barrier layer 48.

Figure 3H:
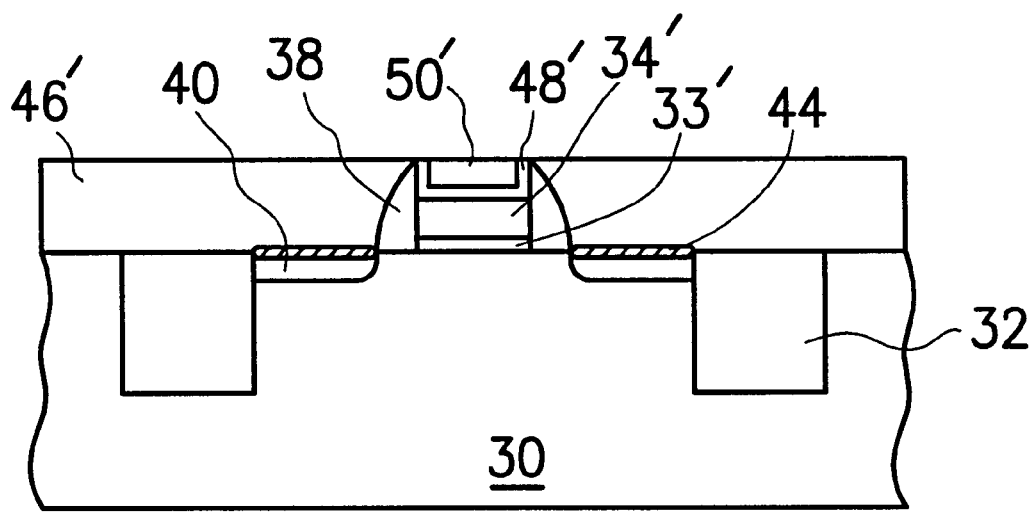

As shown in FIG. 3H, the conductive layer 50 is planarized to expose the inter-layer dielectric layer 46' while retaining a conductive layer 50' and a barrier layer 48' within the groove 39. The conductive layer 50 can be planarized using a chemical-mechanical polishing method. Since tungsten has a coefficient of expansion similar to silicon and tungsten deposited by chemical vapor deposition has low internal stress and good step coverage, tungsten is commonly used as a material to form interconnects. Furthermore, gate terminals with tungsten coating has a lower resistance, and that tungsten has a higher melting point than other metals. Therefore, tungsten gate terminals are more stable and better able to withstand thermally activated distortion in subsequent operations.

In summary the method of manufacturing MOS device according to this invention has the following special advantages:

1. The combination of a metallic layer with a polysilicon layer to form a gate terminal can reduce the resistance of the gate electrode considerable.

2. The use of high melting point tungsten to form the conductive layer of the gate terminal is able to maintain a thermally stable structure despite the many subsequent thermal operations. Therefore, device failure resulting from thermal operations is minimized.

3. By depositing an anti-reflection coating and using a damascene process to form the conductive layer of a gate terminal, photo-developing a mask in order to form a conductive layer is unnecessary. Hence, problems related to the misalignment of photomask are eliminated.

4. Since damascene technique is used to form the metallic layer of the gate terminal followed by removing the excess metal using a chemical-mechanical polishing method, there is no need to perform a plasma etching operation for removing the metal. Therefore, plasma damages or poor product quality resulting from contamination by the large amount of particles generated during plasma operation will not occur.

5. By forming a titanium nitride/tungsten (TiN/W) over the polysilicon layer to lower the resistance, diffusion of ions from the $n^+/p^+$ polycide layer during an annealing is also prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing MOS device, comprising the steps of:

providing a semiconductor substrate;

forming a polysilicon gate over the semiconductor substrate, and then depositing an anti-reflection coating on top of the polysilicon gate;

forming spacers on the sidewalls of the polysilicon gate and the anti-reflection coating;

forming source/drain regions in the substrate on each side of the spacer-coated gate structure, and then forming a metal suicide layer over each source/drain region;

forming an inter-layer dielectric layer over the spacers and the semiconductor substrate but exposing the anti-reflection coating;

removing the anti-reflection coating within the inter-layer dielectric layer so that the upper surface of the polysilicon gate is exposed;

forming a barrier layer over the inter-layer dielectric layer and the exposed polysilicon gate surface;

forming a conductive layer over the barrier layer; and removing the conductive layer and the barrier layer above the inter-layer dielectric layer.

2. The method of claim 1, wherein the step of forming the anti-reflection coating includes depositing silicon oxynitride.

3. The method of claim 1, wherein the step of forming the anti-reflection coating includes depositing silicon nitride.

4. The method of claim 1, wherein the step of forming the spacers includes depositing silicon dioxide.

5. The method of claim 1, wherein the step of forming metal silicide layer over the source/drain regions includes using a self-aligned suicide process.

6. The method of claim 1, wherein the step of forming the inter-layer dielectric layer includes using a chemical vapor deposition method.

7. The method of claim 1, wherein the step of removing the anti-reflection layer includes using a wet etching method.

8. The method of claim 7, wherein the step of removing the anti-reflection layer in a wet etching operation includes using hot phosphoric acid.

9. The method of claim 1, wherein the step of forming the barrier layer includes depositing titanium nitride.

10. The method of claim 1, wherein the step of forming the conductive layer includes depositing tungsten.

11. The method of claim 1, wherein the step of removing the conductive layer and barrier layer above the inter-layer dielectric layer includes a chemical-mechanical polishing method.

12. A method of manufacturing MOS device, comprising the steps of:

providing a semiconductor substrate, wherein a device isolation structure has already formed thereon;

depositing a gate oxide layer over the semiconductor substrate;

depositing a polysilicon layer over the gate oxide layer;

depositing an anti-reflection coating over the gate oxide layer;

patterning with a mask to remove a portion of the anti-reflection coating, the gate oxide layer and the polysilicon layer and forming a gate structure;

forming spacers on the sidewalls of the gate structure;

forming source/drain regions in the substrate on each side of the spacer-coated gate structure;

forming a metal silicide layer over each source/drain region;

forming an inter-layer dielectric layer over the gate structure and the substrate;

removing a portion of the inter-layer dielectric layer to expose the anti-reflection coating;

removing the anti-reflection coating to expose the polysilicon layer;

forming a barrier layer over the inter-layer dielectric layer and the exposed polysilicon layer;

forming a conductive layer over the barrier layer; and removing a portion of the conductive layer and the barrier layer to expose the inter-layer dielectric layer so that only a portion of the conductive layer and a portion of the barrier layer lying above the polysilicon layer is retained.

13. The method of claim 12, wherein the step of forming the metal silicide layer further includes the substeps of:

forming a metallic layer over the gate structure and the semiconductor substrate in the source/drain regions;

heating the substrate so that metal within the metallic layer and silicon within the source/drain region reacts to form a metal silicide layer; and removing the unreacted and residual metal in the metallic layer.

14. The method of claim 13, wherein the step of forming the metallic layer includes a sputtering method.

15. The method of claim 13, wherein the step of heating the substrate includes carrying out a rapid thermal process.

16. The method of claim 13, wherein the step of removing the unreacted and residual metal in the metallic layer includes using a wet etching method.

17. The method of claim 13, wherein the anti-reflection coating has a thickness of about 2500 Å.

* * * * *